United States Patent [19]

Davenport

[11] Patent Number: 5,568,001
[45] Date of Patent: Oct. 22, 1996

[54] SAW DEVICE HAVING ACOUSTIC ELEMENTS WITH DIVERSE MASS LOADING AND METHOD FOR FORMING SAME

[75] Inventor: Roger A. Davenport, Ft. Lauderdale, Fla.

[73] Assignee: Motorola, Inc., Schaumburg, Ill.

[21] Appl. No.: 345,042

[22] Filed: Nov. 25, 1994

[51] Int. Cl.$^6$ .................................................. H01L 41/08
[52] U.S. Cl. .................. 310/313 R; 310/312; 310/313 D
[58] Field of Search ................................ 310/312, 313 R, 310/313 D

[56] References Cited

U.S. PATENT DOCUMENTS

| | | | |
|---|---|---|---|
| 3,760,204 | 9/1973 | Yester | 310/8.2 |
| 3,882,433 | 5/1975 | Subramanian | 310/313 R |
| 3,931,598 | 1/1976 | Bongianni | 310/313 R |
| 4,353,046 | 10/1982 | Hartmann | 310/313 D |
| 4,387,355 | 6/1983 | Uno et al. | 333/195 |
| 4,454,488 | 6/1984 | Hartmann | 310/313 D |
| 4,473,888 | 9/1984 | Smith | 310/313 R |
| 4,902,925 | 2/1990 | Wright | 310/313 B |
| 5,162,689 | 11/1992 | Fliegel et al. | 310/313 D |
| 5,212,420 | 5/1993 | Hickernell et al. | 310/313 D |
| 5,216,312 | 6/1993 | Baer et al. | 310/313 D |
| 5,220,234 | 6/1993 | Flory et al. | 310/313 D |
| 5,321,331 | 6/1994 | Baer et al. | 310/313 D |

FOREIGN PATENT DOCUMENTS

| | | | |
|---|---|---|---|
| 0023609 | 1/1989 | Japan | 310/313 D |

*Primary Examiner*—Thomas M. Dougherty
*Attorney, Agent, or Firm*—Andrew S. Fuller

[57] ABSTRACT

A surface acoustic wave device (100), includes a piezoelectric substrate (105) having a surface acoustic wave structure with an acoustic region (130). An acoustic element (115) disposed in a portion (110) of the acoustic region (130), has a different mass loading than an acoustic element (122) disposed in another portion (120) of the acoustic region (130).

8 Claims, 3 Drawing Sheets

| RESONATOR STRUCTURE | Rp OHMS | Fs MHZ | Fp MHZ | Qu | REFLECTOR FRACTIONAL BANDWIDTH |
|---|---|---|---|---|---|
| TRANSDUCER 1267 Å NO REFLECTORS | 592 | 850 | 930 | 121.9 | |
| TRANSDUCER 2667 Å NO REFLECTORS | 342 | 821 | 907 | 62.6 | |
| TRANSDUCER 1267 Å REFLECTOR 1267 Å | 896.5 | 850 | 930 | 184.5 | 6% |
| TRANSDUCER 2667 Å REFLECTOR 2667 Å | 506 | 821 | 907 | 92.6 | 10% |
| TRANSDUCER 1267 Å REFLECTOR 2667 Å | 875 | 850 | 930 | 180 | 10% |

SAW DEVICE HAVING ACOUSTIC ELEMENTS WITH DIVERSE MASS LOADING AND METHOD FOR FORMING SAME

TECHNICAL FIELD

This invention relates in general to surface acoustic wave devices.

BACKGROUND OF THE INVENTION

Surface acoustic wave (SAW) devices use surface waves propagated on the surface of an elastic solid for electronic signal processing. SAW devices are typically implemented on a piezoelectric substrate using transducers with metal film interdigital fingers which generate and detect acoustic waves. Within this document, the term "acoustic element" is used to define that portion of the geometry of a SAW structure that interacts with, detects, or generates, acoustic waves within an acoustically active region of the SAW structure. For example, within a transducer, the acoustic elements are the interdigitated fingers within the acoustic track. In the case of a reflector, the acoustic elements are the conductive strips within the reflector. The geometry of the acoustic elements on the piezoelectric substrate plays a significant role in the signal processing and frequency response characteristics of a SAW device.

In addition to the SAW geometry, design parameters in a SAW device design include the acoustic attenuation and reflection coefficient of acoustic elements on the SAW structure, which in turn help determine the acoustic bandwidth and loss of a particular SAW device component. For example, a transducer having a low reflection coefficient per finger typically has a narrow acoustic bandwidth and a low loss. The reverse is true such that a transducer with a high reflection coefficient usually has a wide acoustic bandwidth and high loss. Oftentimes, it is desirable to have a SAW device component with low loss while providing a wide acoustic bandwidth. However, because of prior art manufacturing techniques, a tradeoff is made between the acoustic bandwidth and the loss depending on the intended use of the SAW device. These tradeoffs can result in more complex product designs requiring circuits having a low loss and high frequency response bandwidth.

There is a need to provide a SAW device that has a low loss and a wide acoustic bandwidth. Such devices are not generally found in the prior art because of the tradeoff which must be made between acoustic attenuation and reflection coefficient of acoustic elements within the SAW device. However, such tradeoffs can result in product design complexity. For example, in a filter application, multiple SAW devices may have to be combined to satisfy the needs of low loss and wide acoustic bandwidth. Therefore, an improved design approach is needed for surface acoustic wave devices.

BRIEF DESCRIPTION OF THE DRAWINGS

FIG. 7 is a table of simulated results showing performance parameters of various resonator structures, in accordance with the present invention.

DETAILED DESCRIPTION OF THE PREFERRED EMBODIMENT

Figure 1:
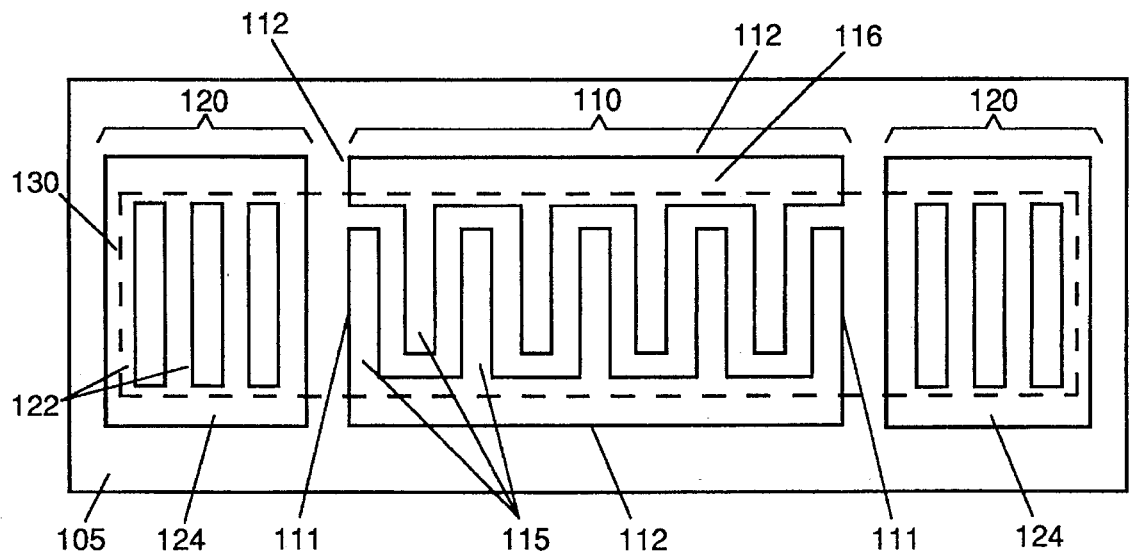
FIG. 1 is a block diagram representing the top view of a SAW resonator, in accordance with the present invention.

While the specification concludes with claims defining the features of the invention that are regarded as novel, it is believed that the invention will be better understood from a consideration of the following description in conjunction with the drawing figures, in which like reference numerals are carried forward.

Generally, the present invention provides for a surface acoustic wave (SAW) device with improved performance characteristics.

Particularly, a SAW device is constructed such that a localized area of an acoustically active region has selected acoustic elements with diverse mass loading characteristics. In one embodiment, the SAW device has metallization patterns, and mass loading is controlled by varying metallization thicknesses or content of individual acoustic elements, to increase or decrease the acoustic reflectivity and attenuation of these acoustic elements. Using the teachings of the present invention, a SAW device can be designed to having an increase in acoustic bandwidth and a reduction in loss by varying the mass loading of acoustic elements within selected portions of the SAW device.

FIG. 1 is a block diagram showing a top view of a SAW resonator 100, in accordance with the present invention. The SAW resonator 100 is formed on a piezoelectric substrate 105 upon which conductive patterns form a transducer 110, and two reflectors 120 situated on opposite side of the transducer 110. The transducer 110 and reflectors 120 are acoustically coupled to share a common acoustic track 130. The transducer 110 includes an opposing pair of electrodes 112, each having a set of interdigitated fingers 115 which are electrically coupled by a bussbar 116. The reflectors 120 comprise multiple fingers in the form of conductor strips 122 which are shorted together by a bussbar 124. In operation, the electrodes 112 are electrically excited such that rapidly changing electrical fields between the interdigitated fingers 115 generate acoustic waves. As is well known in the art, the acoustic waves travel within the transducer 110 along the acoustic track 130. Inevitably, some of acoustic energy escape from the transducer along its edges. The reflectors 120 are included to reflect the escaped acoustic energy back within the transducer 110.

Generally, the behavior of a SAW device is dependent upon the properties of the piezoelectric material forming the substrate, as well as the geometry of conductive patterns disposed on the substrate. In a typical prior art SAW device, the piezoelectric substrate is selected, and the SAW conductive geometry defined, to present a particular frequency response. Prior art conductive patterns are formed to have the same metallization thickness, particularly in the acoustically active region. The thickness of the metallization of the conductive pattern affords a particular mass loading, which in part, determines the acoustic attenuation and reflection coefficient of each acoustic element. As metallization thickness increases, the mass loading increases, which results in a higher acoustic attenuation per acoustic element. However, a high acoustic attenuation typically means a high loss for a particular SAW configuration. If the SAW metallization is made thinner the acoustic attenuation is reduced which results in a lower overall loss of the SAW device. In the case of a resonator, thinner metallization results in a reduction of reflectivity per finger within the transducer causing more acoustic energy to escape out of the ends 111 of the transducer. Similarly, a thinner metallization for the conductive strips of the reflectors reduces the reflection coefficient per finger of the reflectors and consequently reduces the reflector bandwidth.

Figure 2:
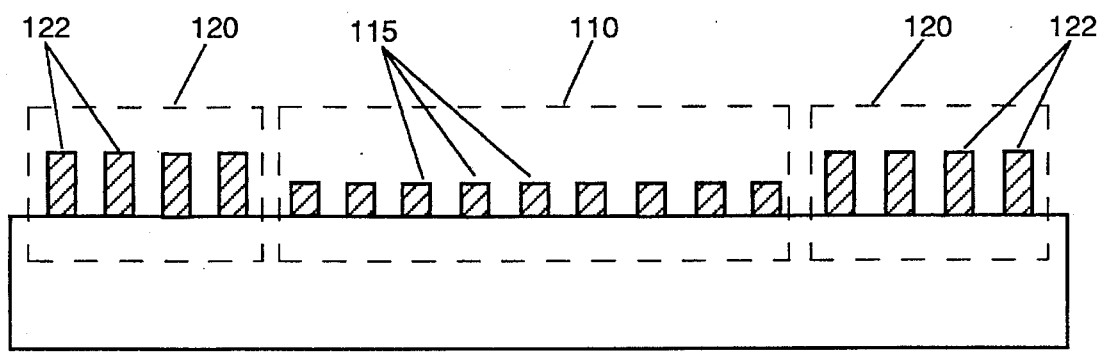
FIG. 2 is a cross sectional view of the resonator of FIG. 1, depicting different metallization thicknesses in a selected localized area, in accordance with the present invention.

FIG. 2 is a cross sectional view of the resonator of FIG. 1, depicting different metallization thicknesses in a selected localized area, in accordance with the present invention. To reduce acoustic attenuation within the transducer, and consequently the acoustic attenuation losses, the transducer fingers 115 are formed using a thin layer of metallization. However, the conductive strips 122 (acoustic elements) of the reflectors 120 are formed from metallization having a thickness higher than that of the transducer 110. The thicker layer of metallization results in a greater mass loading for the acoustic elements of the reflectors 120, which in turn results in an increased reflectivity per acoustic element for the reflectors 120. Thus, in general, the SAW resonator has a SAW structure or geometry with an acoustic region defined by the acoustic track 130 of the transducer 110 and the reflectors 120. Each acoustic element 115 of the transducer 110 has a mass loading characterized by its metallization thickness. Similarly, the acoustic elements of the reflectors, i.e., the conductive strips, each has a mass loading characterized by the thickness of the metallization of each conductive strip. However the mass loading of the conductive strips of the reflectors is different than the mass loading of the fingers of the transducer, and in the preferred embodiment, the mass loading of the conductive strips is higher. A SAW resonator constructed in this manner has the benefit of both low loss, within the transducer 110, and high reflectivity per finger within the reflectors 120 to increase the acoustic bandwidth of the reflectors 120, and consequently the bandwidth of the SAW device 100.

Figure 3:
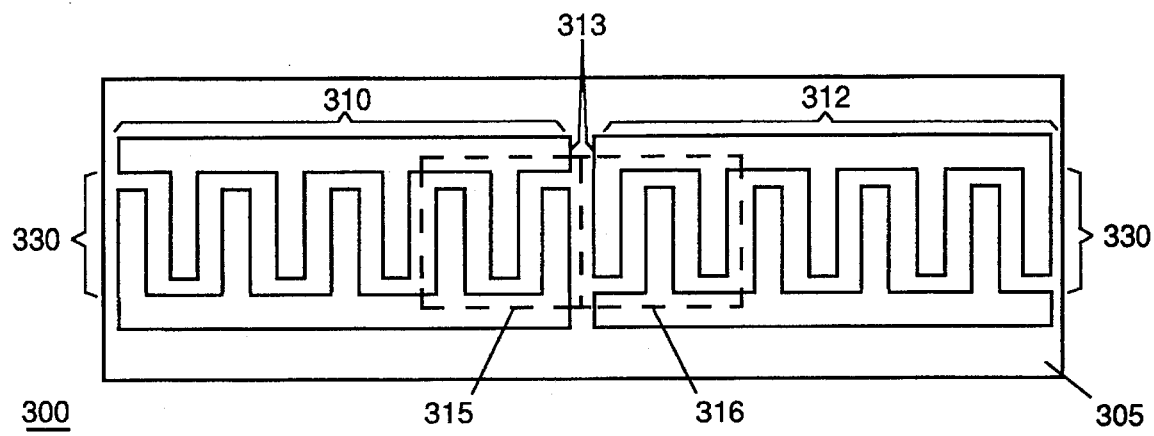
FIG. 3 is a block diagram representing the top view of a SAW filter, in accordance with the present invention.
Figure 4:
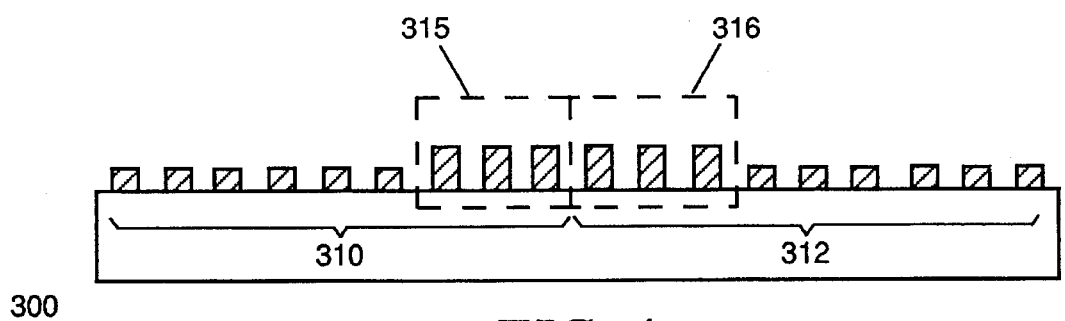
FIG. 4 is a cross sectional view of a the filter of FIG. 3, depicting different metallization thicknesses in selected localized areas, in accordance with the present invention.

FIG. 3 is a block diagram showing the top view of a SAW filter 300, in accordance with the present invention. The SAW filter 300 has two adjacent transducers 310, 312 disposed on a piezoelectric substrate 305. FIG. 4 shows a cross sectional view of one embodiment of the SAW filter of FIG. 3, in accordance with the present invention. Referring to FIGS. 3 and 4, the SAW filter 300 is constructed, according to the invention, to reduce acoustic coupling between adjacent transducers 310, 312 which share a common acoustic track. The acoustic coupling is reduced by increasing the reflectivity per finger of the fingers of the transducers which are in localized areas 315, 316, close to the ends 313 of the transducers, and close to an adjacent transducer. The mass loading of fingers in the localized areas 315, 316 is increased, by increasing the metallization thickness of those particular fingers, in order to increase the reflectivity per finger. As a result of the increase reflectivity, less energy escapes the transducers, and the coupling between both transducers is reduced. Thus, each transducer 310, 312 has a portion 315, 316 having fingers having a mass loading different (in this case higher) than the mass loading of fingers in other portions of the transducer. When a higher mass loading is placed on the fingers near the ends of adjacent transducers, reflectivity is increased at those fingers, and acoustic energy is retained within the transducers.

Figure 5:
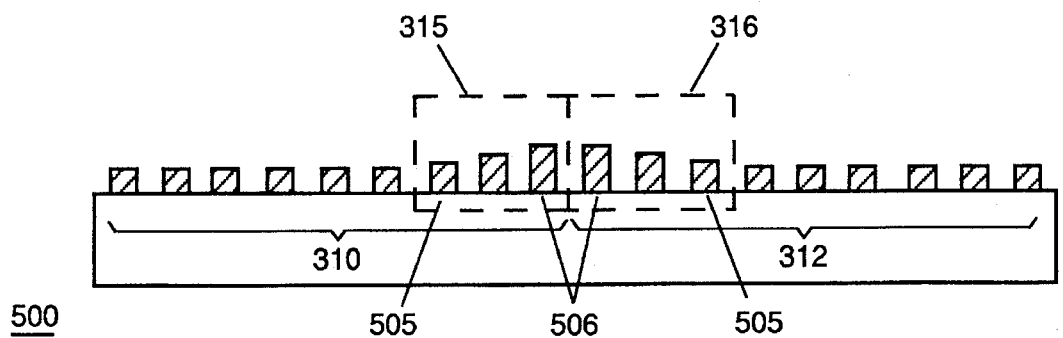
FIG. 5 is a cross sectional view of a second embodiment of the filter of FIG. 3, depicting gradual changes in metallization thicknesses in a selected localized area, in accordance with the present invention.

FIG. 5 shows a cross-sectional view of a second embodiment 500 of the SAW filter of FIG. 3, with selected localized areas having gradual changes in metallization thicknesses, in accordance with the present invention. The SAW filter of FIG. 5 includes, in localized areas 315, 316 near the ends of the transducers 310, 312, at least three acoustic elements, i.e., transducer fingers 505, 506, and intervening fingers, having successive acoustic elements with incrementally increasing mass loading. In other words, between one acoustic element 505 within the transducer and another acoustic element 506 located at the end of the transducer, the mass loading, characterized by the metallization thickness, of each acoustic element incrementally increases. With this embodiment, the same amount of acoustic energy could be retained at a lower loss within the transducer, when compared to the embodiment shown in FIG. 4.

Figure 6:
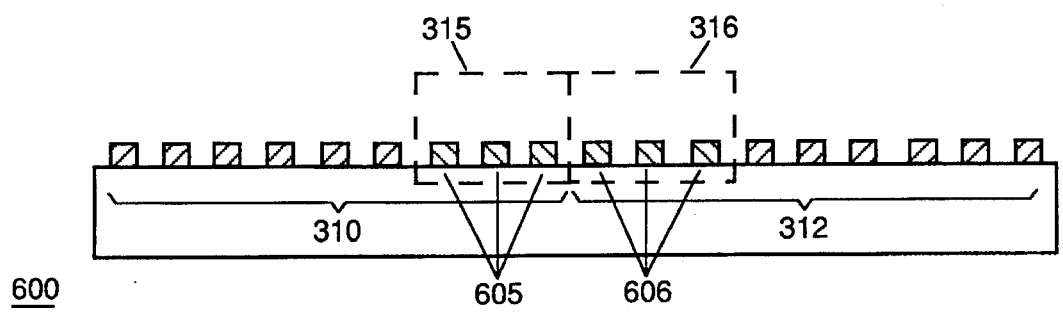
FIG. 6 is a cross sectional view of a third embodiment of the filter of FIG. 3, depicting different metallization content in a selected localized area, in accordance with the present invention.

FIG. 6 is a cross sectional view of a third embodiment 600 of the SAW filter of FIG. 3 in which the mass loading of the acoustic elements 605, 606 are changed by varying the content of the metallization, rather than the thickness. For example, a metal having a higher density may be used to increase the mass loading of an acoustic element, to increase reflectivity per finger.

A SAW device, in accordance with the present invention, can be formed using a metallization process, which incorporates some processes well known in the art. For example, a two step metallization procedure used to form the acoustic elements on a piezoelectric substrate provided for implementing a SAW device. First, a thickness of metal equal to desired thickness of the reflector ($T_r$) minus the desired metallization thickness of the transducer ($T_t$) is deposited on the substrate. A mask is then applied to the substrate and the deposited metal etched off the substrate, except for the areas where the thicker metal is desired, which are exposed. A second layer of metal is then deposited having a thickness of the desired metallization thickness of the transducer ($T_t$). The substrate is then etched with a mask pattern defining the SAW device geometry. Alternatively, different types of metals may be used in the various metallization steps to achieve particular mass loading requirements.

FIG. 7 shows a table of some potential results for a SAW resonator constructed according to the present invention. The table compares SAW device performance parameters including: the parallel equivalent resistance at parallel resonance or anti-resonance ($R_p$ Ohms); the series resonant frequency ($F_s$ MHZ); the parallel resonant or anti-resonant frequency ($F_p$ MHZ); the unloaded quality factor at anti-resonance ($Q_u$); and the reflector fractional bandwidth over which the device is low loss (REFLECTOR FRACTIONAL BANDWIDTH), for various types of resonator structures. When a thin layer of metallization is used for the transducer, i.e., 1267 angstroms (Å), and no reflectors are used, energy leaves the ends of the transducers limiting $Q_u$ to approximately 122. When the transducer is formed from a metal having an increased metallization thickness, i.e., 2667 Å, and again no reflectors, the increase acoustic losses reduces $Q_u$ to approximately 63. When a reflector is included having the same thickness of metallization as the transducer of thickness 1267 Å, $Q_u$ increases substantially; however, the bandwidth is limited by the reflector bandwidth. When a reflector is included having the same thickness of metallization as the transducer of thickness 2667 Å, the limiting bandwidth of the reflector is increased; however, the increased loss in the reflector degrades $Q_u$. However, when, according to the invention, the transducer is formed from the thin layer of metallization, i.e., 1267Å, and the reflector is formed with a thicker layer of metallization, i.e., 2667Å, a low loss wide bandwidth device is achieved. Note that there was a slight degradation (of 2%) in $Q_u$, when compared to the resonator with the thin layer of metallization; however, the limiting bandwidth of the reflector was increased (by 70%).

The present invention offers significant benefits. SAW devices can be constructed having a low loss while retaining a wide tuning range, i.e., a wide acoustic bandwidth. Such a device is very desirable in the art. By varying the mass loading, such as by varying the metallization thickness, of acoustic elements within specific localized portions of a SAW device, a SAW designer has substantial flexibility in varying the performance characteristics of a SAW device. Such flexibility is very desirable in the art.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A surface acoustic wave (SAW) device, comprising:

a piezoelectric substrate; and a first SAW transducer disposed on the piezoelectric substrate, the first SAW transducer having a plurality of interdigitated transducer fingers including first and second distinct portions that have a common acoustic track;

wherein the first portion is located at an edge of the transducer along the common acoustic track, and consists of a plurality of adjacent transducer fingers each having a metallization thickness in height greater than that of each finger in the second portion.

2. The surface acoustic wave device of claim 1, further comprising:

a second SAW transducer disposed on the piezoelectric substrate, the second SAW transducer having first and second portions each consisting of a plurality if adjacent transducer fingers, the first portion of the second SAW transducer being adjacent to the first portion of the first SAW transducer, wherein each transducer finger of the first of the first portion of the second SAW transducer has a metallization thickness in height greater than that of the transducer fingers in the second portion of the second SAW transducer.

3. A surface acoustic wave (SAW) device, comprising:

a piezoelectric substrate; and a SAW structure disposed on the piezoelectric substrate, the SAW structure comprising at least three acoustic elements in series having successive acoustic elements each with a successive incremental increase in metallization height.

4. A surface acoustic wave (SAW) device, comprising:

a first interdigitated SAW transducer disposed on a piezoelectric substrate, the first interdigitated SAW transducer having first and second portions in a common acoustic track, each of the first and second portions consisting of adjacent transducer fingers, the first portion of the first interdigitated SAW transducer being located at an edge of the transducer within the common acoustic track, said first portion having each transducer finger with a metallization height different than that of the transducer fingers of the second portion of the first interdigitated SAW transducer.

5. The surface acoustic wave device of claim 4, wherein the first interdigitated SAW transducer has at least three successive fingers each with a successive incremental increase in metallization height.

6. The surface acoustic wave device of claim 4, further comprising:

a second interdigitated SAW transducer disposed on the piezoelectric substrate, the second interdigitated SAW transducer having first and second portions each consisting of adjacent transducer fingers, the first portion of the second interdigitated SAW transducer being located adjacent to the first portion of the first interdigitated SAW transducer, the first portion of the second interdigitated SAW transducer having each transducer finger with a metallization height different than that of the transducer finger of the second portion of the second interdigitated SAW transducer.

7. A surface acoustic wave (SAW) device, comprising:

a piezoelectric substrate; and a first SAW transducer disposed on the piezoelectric substrate, the first SAW transducer having a plurality of interdigitated transducer fingers including first and second distinct portions that have a common acoustic track;

wherein the first portion is located at an edge of the transducer within the common acoustic track, and consists of a plurality of adjacent transducer fingers each formed from a material different than that of each finger in the second portion.

8. The surface acoustic wave device of claim 7, further comprising:

a second SAW transducer disposed on the piezoelectric substrate, the second SAW transducer having first and second portions each consisting of a plurality of transducer fingers, the first portion of the second SAW transducer being adjacent to the first portion of the first SAW transducer, wherein each transducer finger of the first portion of the second SAW transducer is formed a material different than that of the transducer fingers in the second portion of the second SAW transducer.

* * * * *